(12) United States Patent
Dohner et al.

(10) Patent No.: US 11,527,684 B2
(45) Date of Patent: Dec. 13, 2022

(54) PATTERNED DOWNCONVERTER AND ADHESIVE FILM FOR MICRO-LED, MINI-LED DOWNCONVERTER MASS TRANSFER

(71) Applicant: LUMILEDS LLC, San Jose, CA (US)

(72) Inventors: Emma Dohner, Redwood City, CA (US); Daniel Roitman, Menlo Park, CA (US)

(73) Assignee: Lumileds LLC, San Jose, CA (US)

( * ) Notice: Subject to any disclaimer, the term of this patent is extended or adjusted under 35 U.S.C. 154(b) by 0 days.

(21) Appl. No.: 17/112,633

(22) Filed: Dec. 4, 2020

(65) Prior Publication Data

US 2022/0181527 A1 Jun. 9, 2022

(51) Int. Cl.
*H01L 33/50* (2010.01)
*H01L 25/075* (2006.01)

(52) U.S. Cl.
CPC ........ *H01L 33/505* (2013.01); *H01L 25/0753* (2013.01); *H01L 2933/0041* (2013.01); *H01L 2933/0091* (2013.01)

(58) Field of Classification Search
None
See application file for complete search history.

(56) References Cited

U.S. PATENT DOCUMENTS

| | | |
|---|---|---|
| 2011/0266569 A1 | 11/2011 | Grigoriy et al. |
| 2013/0221835 A1 | 8/2013 | Basin et al. |
| 2015/0179901 A1 | 6/2015 | Ok et al. |
| 2017/0263826 A1 | 9/2017 | Huska et al. |
| 2020/0019016 A1 | 1/2020 | Oketani et al. |
| 2020/0098950 A1 | 3/2020 | Basin et al. |
| 2020/0343419 A1 | 10/2020 | Göötz et al. |

OTHER PUBLICATIONS

From the EPO as the ISA, Notification of Transmittal of the International Search Report and the Written Opinion of the International Searching Authority, or the Declarations, PCT/US2021/061831, dated Mar. 28, 2022, 14 pages.
From the EPO as the ISA, Notification of Transmittal of the International Search Report and the Written Opinion of the International Searching Authority, or the Declarations, PCT/US2021/061832, dated Mar. 30, 2022, 15 pages.

*Primary Examiner* — Bo B Jang

(57) ABSTRACT

A downconverter layer transfer device, and methods of making and using the downconverter layer transfer device, are disclosed. A downconverter layer transfer device includes a release liner and a downconverter layer disposed on the release liner, the downconverter layer including a downconverter material dispersed throughout an adhesive, the downconverter layer being solid and non-adhesive at a first temperature, and adhesive at an elevated temperature above the first temperature.

13 Claims, 13 Drawing Sheets

PATTERNED DOWNCONVERTER AND ADHESIVE FILM FOR MICRO-LED, MINI-LED DOWNCONVERTER MASS TRANSFER

FIELD OF THE INVENTION

This disclosure generally relates to devices and methods used in the manufacture of light emitting devices (LEDs) for attaching phosphors to LED dies, and LEDs formed using the devices and methods.

BACKGROUND

Semiconductor light emitting diodes and laser diodes (collectively referred to herein as "LEDs") are among the most efficient light sources currently available. The emission spectrum of an LED typically exhibits a single narrow peak at a wavelength determined by the structure of the device and by the composition of the semiconductor materials from which it is constructed. By suitable choice of device structure and material system, LEDs may be designed to operate at ultraviolet, visible, or infrared wavelengths.

LEDs may be combined with one or more wavelength converting materials (generally referred to herein as "phosphors" or "downconverters") that absorb light emitted by the LED and in response emit light of a longer wavelength. For such phosphor-converted LEDs ("pcLEDs"), the fraction of the light emitted by the LED that is absorbed by the phosphors depends on the amount of phosphor material in the optical path of the light emitted by the LED, for example on the concentration of phosphor material in a phosphor layer disposed on or around the LED and the thickness of the layer. Phosphors may be embedded in a silicone matrix that is disposed in the path of light emitted by the LED.

Phosphor-converted LEDs may be designed so that all of the light emitted by the LED is absorbed by one or more phosphors, in which case the emission from the pcLED is entirely from the phosphors. In such cases the phosphor may be selected, for example, to emit light in a narrow spectral region that is not efficiently generated directly by an LED.

Alternatively, pcLEDs may be designed so that only a portion of the light emitted by the LED is absorbed by the phosphors, in which case the emission from the pcLED is a mixture of light emitted by the LED and light emitted by the phosphors. By suitable choice of LED, phosphors, and phosphor composition, such a pcLED may be designed to emit, for example, white light having a desired color temperature and desired color-rendering properties.

SUMMARY

In one aspect a downconverter layer transfer device is provided, the downconverter layer transfer device including a release liner, and a downconverter layer disposed on the release liner, the downconverter layer including a downconverter material dispersed throughout an adhesive, the downconverter layer being solid and non-adhesive at a first temperature, and adhesive at an elevated temperature above the first temperature. The downconverter layer may include two or more downconverter layer pixels, each downconverter layer pixel including a different downconverter material and disposed on a different area of the release liner. The downconverter layer transfer device may include a space between the two or more downconverter layer pixels. The two or more downconverter layer pixels may be adjacent and meet at a junctions. The downconverter layer transfer device may include a siliconized layer disposed between the release liner and the downconverter layer. The downconverter material may include at least one of a phosphor, an organic dye, a quantum dot, and a scattering agent. The shear modulus $G^*$ (at 1 Hz) of the downconverter layer at the first temperature is greater than 100 KPa, and the shear modulus $G^*$ (at 1 Hz) of the downconverter layer at the elevated temperature is between 1 KPa and 100 KPa.

In another aspect, a lighting device is provided, the lighting device including a plurality of individually addressable light emitting diodes mounted on a substrate, each light emitting diode having a light emitting surface, and a plurality of downconverter layer pixels, each downconverter layer pixel in contact with and adhered to the light emitting surface of one of the light emitting diodes, the downconverter layer pixels comprising an adhesive material and a downconverter material interspersed throughout the adhesive material. The adhesive may be a heat-curable adhesive material that, before curing, is solid and non-adhesive at a first temperature, and is adhesive at an elevated temperature above the first temperature.

In another aspect a method of forming a lighting device is provided, method of forming a lighting device including providing a plurality of light emitting diodes mounted on a substrate, each light emitting diode having a light emitting surface, providing a downconverter layer transfer device having a downconverter layer disposed on a release liner, the downconverter layer including a first downconverter material dispersed throughout an adhesive, aligning the downconverter layer with the light emitting surfaces, bringing the downconverter layer into contact with the light emitting surfaces at an elevated temperature, the elevated temperature being a temperature at which the adhesive adheres to the light emitting surface, cooling the downconverter layer pixels in contact with the light emitting surfaces of the plurality of light emitting diodes to a temperature below the elevated temperature, and removing the release liner, leaving the downconverter layer adhered to the light emitting surface of the plurality of light emitting diodes. The method may further include curing the downconverter layer. Bringing the downconverter layer into contact with the light emitting surfaces at an elevated temperature may include applying a vacuum to the downconverter layer transfer device and the light emitting diodes. Providing the downconverter layer transfer device may include providing the release liner, mixing an adhesive material, the first downconverter material, and solvent to form a first adhesive downconverter mixture, coating the release liner with the first adhesive downconverter mixture, and removing the solvent from the adhesive downconverter mixture to form the downconverter layer. The method may further include, before coating the release liner with the first adhesive downconverter mixture, forming a photoresist pattern on the release liner, the photoresist pattern including wells, wherein coating the release liner with first adhesive downconverter material includes disposing the first adhesive downconverter material in the wells; and removing the photoresist pattern to leave downconverter layer having a pixel pattern of downconverter layer pixels having a space between each of the downconverter layer pixels. The method may further include coating the release liner with a siliconized coating before coating with the adhesive mixture. A first portion of downconverter layer may include the first downconverter material and is disposed on a first area of the release liner, and a second portion of downconverter layer includes a second downconverter material different from the first downconverter material and disposed on a second area of the release liner different than the first area. Providing the downconverter layer transfer device may include providing a release liner, mixing an adhesive material, the first downconverter material, and solvent to form a first adhesive downconverter mixture, mixing the adhesive material, the second downconverter material, and solvent to form a second adhesive downconverter mixture, coating the release liner with the first adhesive downconverter mixture in a pixel pattern on the first area of the release liner, coating the release liner with the second adhesive downconverter mixture in the pixel pattern on the second area of the release liner; and removing the solvent from the first and second adhesive downconverter mixture to form the downconverter layer having downconverter layer pixels. The method may further include before coating the release liner with the first adhesive downconverter mixture and second adhesive downconverter mixture, forming a photoresist pattern on the release liner, the photoresist pattern including wells, wherein coating the release liner with the first adhesive downconverter material includes disposing the first adhesive downconverter material in a first set of the wells and coating the release liner with the second adhesive downconverter material includes disposing the second downconverter material in a second set of the wells different from the first set of the wells; and removing the photoresist pattern to leave a pixel pattern of downconverter layer pixels having a space between each of the downconverter layer pixels. The method may further include coating the release liner with a siliconized coating before coating with the first adhesive mixture and the second adhesive mixture. The downconverter material may include at least one of a phosphor, an organic dye, a quantum dot, and a scattering agent.

DETAILED DESCRIPTION

Figure 1A:
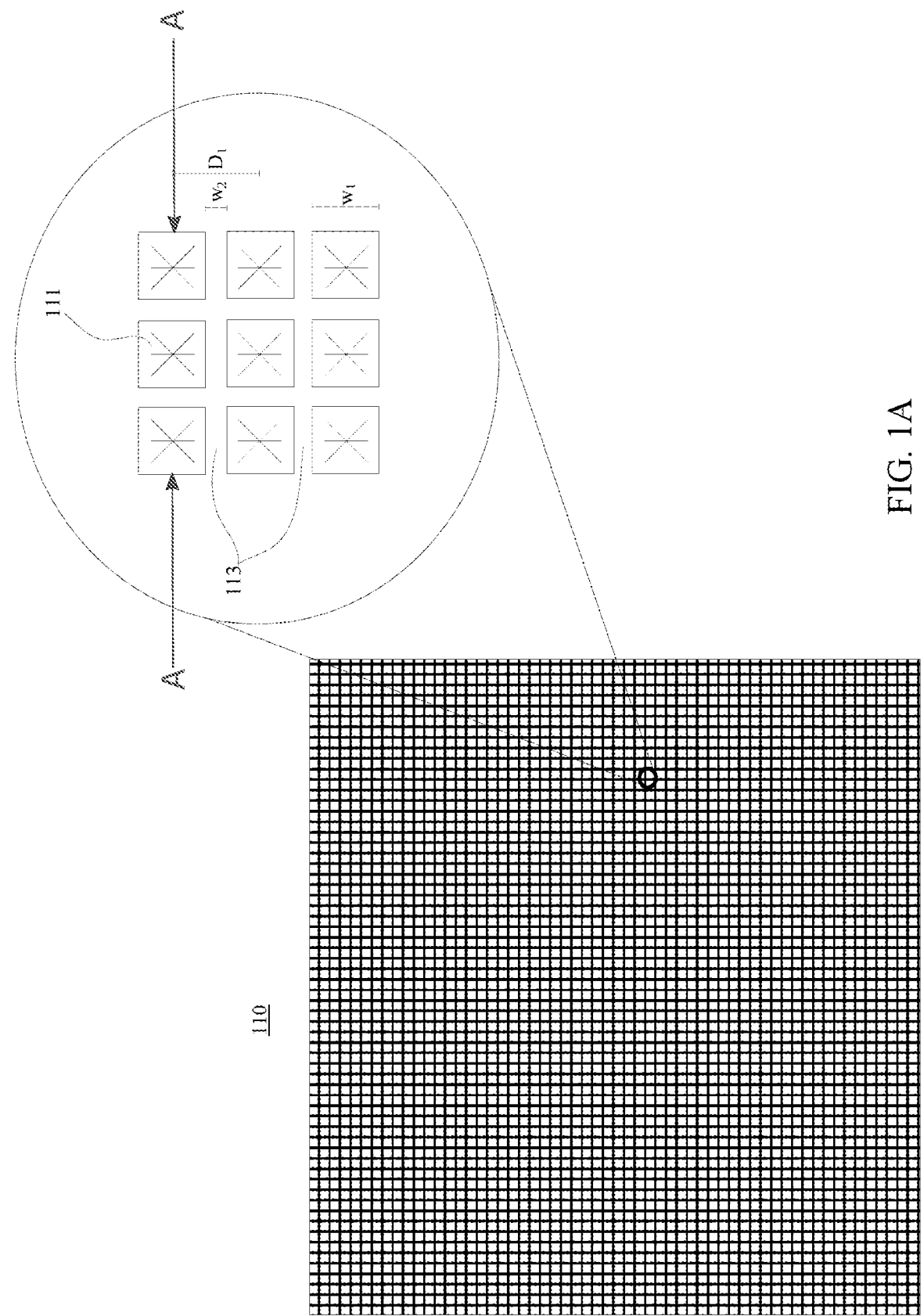
FIG. 1A is a plan view and FIG. 1B a cross-sectional view illustrating an example of a micro-array lighting device. The cross-section view in FIG. 1B is taken through line A-A in FIG. 1A.

The following detailed description should be read with reference to the drawings, in which identical reference numbers refer to like elements throughout the different figures. The drawings, which are not necessarily to scale, depict selective embodiments and are not intended to limit the scope of the invention. The detailed description illustrates by way of example, not by way of limitation, the principles of the invention.

As used herein, spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, for example, the term "below" can encompass both an orientation of above and below, depending on the orientation of the device. The device may be otherwise oriented (rotated 90 degrees or at other orientations) and the spatially relative descriptors used herein interpreted accordingly.

Light emitting pixel arrays are light emitting devices in which a large number of small light emitting devices, such as, for example LEDs, are arrayed on a substrate, which may be a semiconductor die or chip. The individual LEDs, or pixels, in a light emitting pixel array may be individually addressable, may be addressable as part of a group or subset of the pixels in the array, or may not be addressable. Thus, light emitting pixel arrays are useful for any application requiring or benefiting from fine-grained intensity, spatial, and temporal control of light distribution. These applications may include, but are not limited to, precise special patterning of emitted light from pixel blocks or individual pixels. Depending on the application, emitted light may be spectrally distinct, adaptive over time, and/or environmentally responsive. The light emitting pixel arrays may provide pre-programmed light distribution in various intensity, spatial, or temporal patterns. The emitted light may be based at least in part on received sensor data and may be used for optical wireless communications. Associated electronics and optics may be distinct at a pixel, pixel block, or device level.

Light emitting pixel arrays have a wide range of applications. Light emitting pixel array luminaires can include light fixtures which can be programmed to project different lighting patterns based on selective pixel activation and intensity control. Such luminaires can deliver multiple controllable beam patterns from a single lighting device using no moving parts. Typically, this is done by adjusting the brightness of individual LEDs in a 1D or 2D array. Optics, whether shared or individual, can optionally direct the light onto specific target areas Light emitting pixel arrays may be used to selectively and adaptively illuminate buildings or areas for improved visual display or to reduce lighting costs. In addition, light emitting pixel arrays may be used to project media facades for decorative motion or video effects. In conjunction with tracking sensors and/or cameras, selective illumination of areas around pedestrians may be possible. Spectrally distinct pixels may be used to adjust the color temperature of lighting, as well as support wavelength specific horticultural illumination.

Street lighting is an important application that may greatly benefit from use of light emitting pixel arrays. A single type of light emitting array may be used to mimic various street light types, allowing, for example, switching between a Type I linear street light and a Type IV semicircular street light by appropriate activation or deactivation of selected pixels. In addition, street lighting costs may be lowered by adjusting light beam intensity or distribution according to environmental conditions or time of use. For example, light intensity and area of distribution may be reduced when pedestrians are not present. If pixels of the light emitting pixel array are spectrally distinct, the color temperature of the light may be adjusted according to respective daylight, twilight, or night conditions Light emitting arrays are also well suited for supporting applications requiring direct or projected displays. For example, warning, emergency, or informational signs may all be displayed or projected using light emitting arrays. This allows, for example, color changing or flashing exit signs to be projected. If a light emitting array is composed of a large number of pixels, textual or numerical information may be presented. Directional arrows or similar indicators may also be provided.

Vehicle headlamps are a light emitting array application that requires large pixel numbers and a high data refresh rate. Automotive headlights that actively illuminate only selected sections of a roadway can be used to reduce problems associated with glare or dazzling of oncoming drivers. Using infrared cameras as sensors, light emitting pixel arrays activate only those pixels needed to illuminate the roadway, while deactivating pixels that may dazzle pedestrians or drivers of oncoming vehicles. In addition, off-road pedestrians, animals, or signs may be selectively illuminated to improve driver environmental awareness. If pixels of the light emitting pixel array are spectrally distinct, the color temperature of the light may be adjusted according to respective daylight, twilight, or night conditions. Some pixels may be used for optical wireless vehicle to vehicle communication.

Figure 1B:
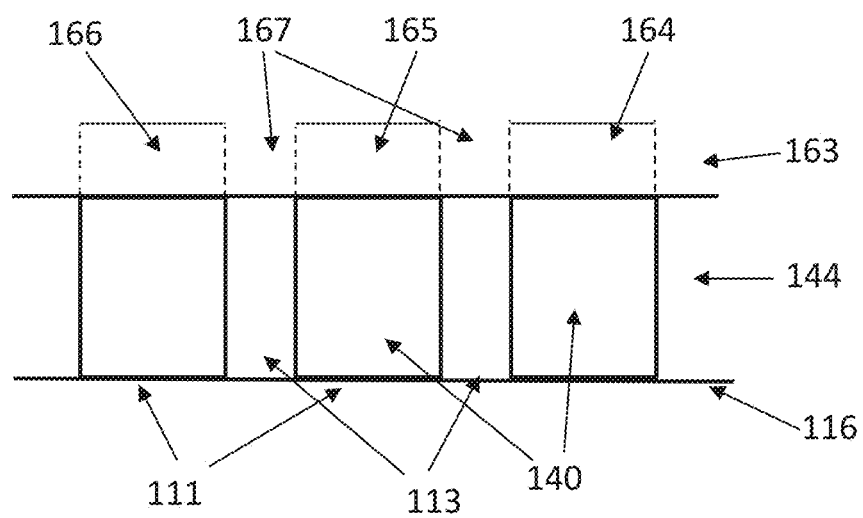

An example of a type of light emitting pixel array is a micro-LED, also referred to as a μLED. FIGS. 1A and 1B illustrate an example of a micro-LED. FIG. 1A shows a plan view of a micro-LED array 110, along with an exploded view of a 3×3 portion of LED array 110. In FIG. 1A, each square 111 represents a single LED, or pixel. As shown in the 3×3 portion exploded view, LED array 110 may include pixels 111 with a width w1, which may be between 30 μm and 500 μm, for example approximately 100 μm or less, e.g. 40 μm. The gaps, or lanes, 113 between the pixels may be separated by a width, w2, which may be between 30 μm and 500 μm, for example, approximately 20 μm or less, e.g., 5 μm. The lanes 113 may provide an air gap between pixels or may contain other material, as shown in FIG. 1B. The distance dl from the center of one pixel 111 to the center of an adjacent pixel 111 may be approximately 120 μm or less (e.g., 45 μm). Such a micro-LED array may have hundreds, thousands, or millions of LEDs positioned together on substrates that may have, for example, an area in the range of centimeters, although the size of the area may vary. It will be understood that the widths and distances provided herein are examples only, and that actual widths and/or dimensions may vary. For instance, the width, w2, may be in the order of at least a millimeter, to form a sparse micro-LED, but may be larger or smaller.

It will be understood that although rectangular pixels arranged in a symmetric matrix are shown in FIGS. 1A and 1B, pixels of any shape and arrangement may be applied to the embodiments disclosed herein. For example, LED array 110 of FIG. 1A may include 10,000 pixels in any applicable arrangement such as a 100×100 matrix, a 200×50 matrix, a symmetric matrix, a non-symmetric matrix, or the like. It will also be understood that multiple sets of pixels, matrixes, and/or boards may be arranged in any applicable format to implement the embodiments disclosed herein.

Micro-LEDs can be formed from pcLEDs. One method for forming a micro-LED is to use epitaxial growth to form the multiple individual LEDs 110 on a die in a flip-chip construction as in known in the art. FIG. 1B illustrates a side view of a portion of one type of micro-LED device taken through line AA of FIG. 1A.

FIG. 1B shows the pixels 111 and lanes 113. Each pixel 111 is formed of an LED die 140, which is one of an array of LED dies 144 positioned on, for example, a substrate 116. Substrate 116 may be, for example, a single semiconductor die or chip, a board or interposer, such as for example a CMOS (complementary metal oxide semiconductor) chip or an MCPCB (metal core printed circuit board). Substrate 116 may provide the electrical signals to each of the LED die 140 in the array of LED dies 144. A downconverter 163 is over and on array of LED dies 144. The downconverter 163 may be formed, for example, of phosphor particles contained in a matrix, for example, garnet particles contained in silicone.

FIG. 1B shows downconverter 163 as singulated, and covering just the individual LED dies 140. However, downconverter 163 may be a single layer covering both the LED dies 140 and the gaps 113 between the LED dies 140. The singulated downconverter 163 shown in FIG. 1B may contain individual downconverter pixels 164, 165, and 166 positioned over individual dies 140. Downconverter 163 may contain a variety of different downconverter materials, each in a different individual downconverter pixel positioned over individual LED dies 140. For example, to form a micro-LED with red, green, and blue emitting pixels (an "RGB micro-LED"), the LED dies 140 may be blue light emitting LED dies, and individual phosphor pixel 164 may be a downconverter that converts blue light to red light, individual phosphor pixel 165 may be a downconverter that converts blue light to green or green/yellow light, and individual phosphor pixel 166 may include only a scattering agent so that the blue light from the LED die is transmitted without conversion. The red, green, and blue light emitted may be combined to form a white light. In one example, the downconverter converts the blue light to a white light to produce a micro-LED that is monochrome white at a CCT of about 5700K. The amount of light emitted by the individual pixels 111 may be individually controlled so as to form a tunable micro-LED in which a mixture of unsaturated green, red, and blue lights emitted can establish a highly efficient tunable white light source. Downconverter 163 may also include spaces 167 between each individual downconverter pixel 164, 165, 166 and aligned with gap 113.

One method of forming a pcLEDs, including micro-LEDs, is to separately form a phosphor converting material into a tile (which also may be referred to as a plate, platelet, wafer, film or other shape), such as, for example, Lumiramic™. The tile is then attached or bonded to the separately formed LED die or array of LED dies. To assemble an RGB micro-LED using this method, after a layer of adhesive is applied to the LED die, a "pick and place" tool is used to place each of the individual phosphor tiles onto each individual LED die to form the individual red, green and blue pixels. This serial pick-and-place approach introduces significant attachment accuracy issues leading to wide gaps between neighboring pixels. The serial pick-and-place method is also time-consuming, posing a bottleneck for throughput, and thus slowing down the manufacturing process. Other methods that may be used include patterning red and green subpixels onto an array of blue die, either via a stamp process, photolithography or ink-jet printing. The stamp process methods can require, for a multi-color array, assembly of the downconverter pixels on the stamp, which involves use of serial pick-and-place to assemble. The photolithography method can require patterning directly onto an array of LEDs, which can be difficult due to variations in topography as well as differences in material types (for instance, lithography on GaN is different from lithography on silicon). Use of inkjet printing can be limited due to difficulty printing high aspect ratio phosphor pixels.

Figure 2:
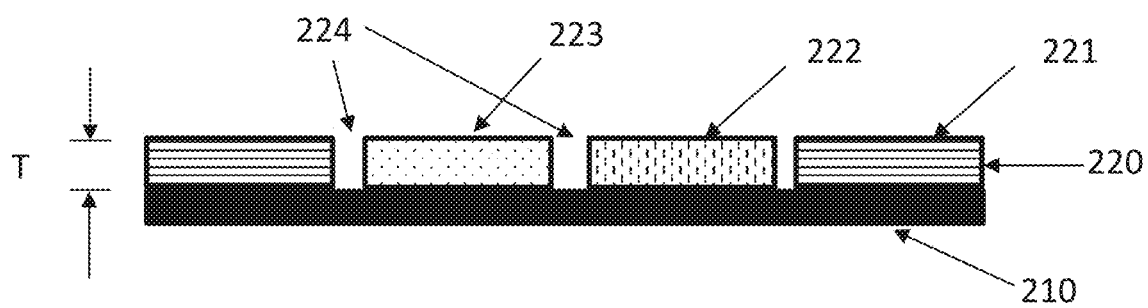
FIG. 2 is a cross-sectional view illustrating a downconverter layer transfer device according to an example embodiment.

FIG. 2 shows a side view of a portion of a downconverter layer transfer device 200 that can be used to form pcLEDs, and, in particular, is useful for forming light emitting pixel arrays, such as RGB micro-LEDs. Downconverter layer transfer device 200 includes a release liner 210 coated with a downconverter layer 220. Downconverter layer 220 includes one or more downconverter materials mixed with an adhesive material, as will be described in more detail below. Downconverter layer 220 may include portions of different types of downconverter materials in separate downconverter layer pixels 221, 222, 223. For example, downconverter layer pixel 221 may include a red downconverter material, downconverter layer pixel 222 may include a green downconverter material, and downconverter layer pixel 223 may contain only a scattering agent. The number of different downconverter materials used in downconverter layer 220, and the arrangement and colors of the different downconverter layer pixels may vary depending on the desired light emitting device to be manufactured. For example, an RGB pattern of downconverter layer pixels may repeat over the entirety of the downconverter layer transfer device. There may be a space 224 between each of the downconverter layer pixels 221, 222, and 223. The size of the downconverter layer pixels 221, 222, 223, and space 224 is set so that when the downconverter layer 220 is transferred to the LED array 144, as described below, the downconverter layer pixels 221, 222, 223 are positioned on top of the individual LEDs 140, to produce a light emitting device as shown above in FIGS. 1A and 1B.

FIG. 2 shows only a portion of a downconverter layer transfer device with just four downconverter layer pixels. In general, a full downconverter layer transfer device may have an area matching the area of, or large enough to cover the light emitting portion of, the LED array 144 on which the downconverter will be positioned to form micro-LED 110. A full downconverter layer transfer device may have an area that covers more than one LED array 144, such that several LED arrays 144 may be manufactured at once. The number of individual downconverter layer pixels 221, 222, 223 may match the number of individual LED dies 140 in the LED array 144, although this is not required. Thus the number of individual downconverter layer pixels in a single downconverter layer transfer device may be in the 100's to the 10,000,000s.

Release liner 210 may be any material, generally in the form of a flexible sheet, capable of holding downconverter layer 220 and capable of releasing downconverter layer 220 in operation (as shown below in FIGS. 3A-3D). Thus, the release liner 210 may be optimized (e.g., for roughness, slippage, and surface energy) so that the downconverter layer 220 coats the release liner 210 evenly, and so that the release liner 210 can release cleanly from the downconverter layer 220 after downconverter layer 220 is transferred to a substrate. Release liner 210 may be a sheet of flexible material, such as polyethylene terephthalate ("PET"), such as, for example, PANAC Corporation SP-PET—50-01 BU. Release liner 210 may be coated with a transfer coating (not shown in FIG. 2) positioned between the release liner 210 and the adhesive layer 220 that enhances the release of the adhesive layer 220. Such a transfer coating may be, for example, a siliconized release coating, examples of which include PANAC Corporation's PDMS release coating on PET liners and as further described in Dow White Paper "*Release Force Understanding—Recent Findings*" by R. Ekeland, J. Tonge, and G. Gordon, 2018, The Dow Chemical Company, incorporated herein by reference in its entirety. In particular, when the release liner 210 is removed (as shown in the examples below), to ensure a clean transfer of the downconverter layer 220 to the substrate, the peel strength between the adhesive layer 220 and release liner 210 may be below 30 N/m, for example, between 1-5 N/m.

Downconverter layer 220 includes the downconverter material and an adhesive material, and is the portion of the downconverter layer transfer device that is transferred and adhered to the substrate, i.e., the LED array 144 to form a micro-LED as will be described in more detail below with respect to FIG. 3A-3E.

The adhesive material used to form the downconverter layer 220 may be chosen to have the following properties. The first is that the adhesive material can be coated evenly onto the release liner 210 to form the downconverter layer transfer device 200. The second is that the adhesive material forms a downconverter layer 220 that is dry, not tacky, and relatively hard, i.e., it does not flow, at a first, lower temperature, e.g., room temperatures. That is, at a first temperature, such as room temperatures (e.g., 15-25° C.) the adhesive material in downconverter layer 220, while adhering to the release liner 210 on which it was formed, is not adhesive enough to attach to a substrate, such as an LED die. For example, the adhesive material in downconverter layer 220 at a first temperature, such as room temperature, may follow the Dahlquist Criterium of shear modulus $G^*$(at 1 Hz)>100 KPa (0.1 MPa), for example shear modulus $G^*$>300 KPa (0.3 MPa). Third, the adhesive material forming the downconverter layer 220 becomes tacky and reflows at elevated temperatures. That is, when heat is applied to the downconverter layer 220, it becomes adhesive, and is then capable of attaching directly to a substrate. For example, an elevated temperature is chosen such that the shear modulus $G^*$ (at 1 Hz) of the adhesive material becomes between shear modulus $G^*$=1 KPa and shear modulus $G^*$=100 KPa, with tan delta typically between 0.5 and 3.0, for example, at between 50° C. and 150° C., e.g., 100° C. Fourth, the adhesive material used to form the downconverter layer 220 is capable of forming a downconverter that provides a strong bond to a target substrate.

In particular, the adhesive material used in downconverter layer 220 may not be adhesive enough to attach directly to a substrate at a first, lower temperature, but becomes adhesive enough at elevated temperature to attach directly to a substrate, such as an LED die, and, after cooling, has a stronger attachment to the substrate than to the release liner 210, such that the release liner may be easily removed. The adhesive material used to form the downconverter layer 220 may be, for example, a siloxane adhesive.

The downconverter material used in downconverter layer 220 may be any downconverter material to be used for the application of the micro-LED, and that is compatible with the adhesive material. Downconverter material may include, for example, phosphor particles, such as garnet particles, organic dyes, such as emissive small molecules such as, for example, $Alq_3$ ($Al(C_9H_6NO)_3$) or polymers such as, for example, PPV (Poly(p-phenylene vinylene), and/or quantum dots, such as, for example, colloidal semiconductor nanocrystals. Downconverter material may also be a scattering agent, such as, for example, $TiO_2$, that scatters the light emitted by the LED 140, but does not change the color of the light emitted.

The thickness T of the downconverter layer 220 is chosen to match the desired target thickness of the downconverter 163 in the final device, and may be in a range of 1 μm to 200 μm, for example, less than 10 μm, in the range of between 5 μm and 10 μm. The adhesive layer 220 may also be formed so that the thickness T is uniform across the layer, for example, T may have a deviation (variation) of less than 20%, for example, less than 10%, across the downconverter layer 220 and between downconverter layer pixels 221 222, 223, 224. That is, each of the downconverter layer pixels 221, 222, 223, 224 has a thickness deviation (variation) of less than 20%, for example, less than 10%, as compared to the thickness T of any of the other downconverter layer pixels 221, 222, 223, 224. Uniform thickness of the downconverter layer pixels 221, 222, 223, 224 is advantageous because the more uniform thickness results in a more uniform appearance of the emitted light. Also advantageously, because the downconverter material is in the adhesive layer, there is no need for a separate bonding layer to attach a tile or other layer containing downconverter material to the LED die. This removes an additional processing step in the formation of the lighting device and results in a device in which the downconverter layer is directly in contact with a light emitting surface of the LED die. Light emitted by the LED die does not need to pass through a bonding layer before passing into a downconverter layer. A further advantage is that there is consistent alignment between the downconverter pixels in the resulting device, as compared to those made by the pick-and-place method, in which there can be random variations in alignment as a result of the pick-and-place process.

FIGS. 3A-3E show a flow chart and illustration of an example of the method of using the downconverter layer transfer device 200. A vacuum lamination process may be used to transfer the downconverter layer 220 onto an LED array 344 similar to the process disclosed in U.S. patent application Ser. No. 16/874,529 titled "Adhesive Film Transfer Coating and Use in Manufacturing of Light Emitting Devices," filed May 14, 2020, incorporated herein by reference in its entirety.

Figure 3A:
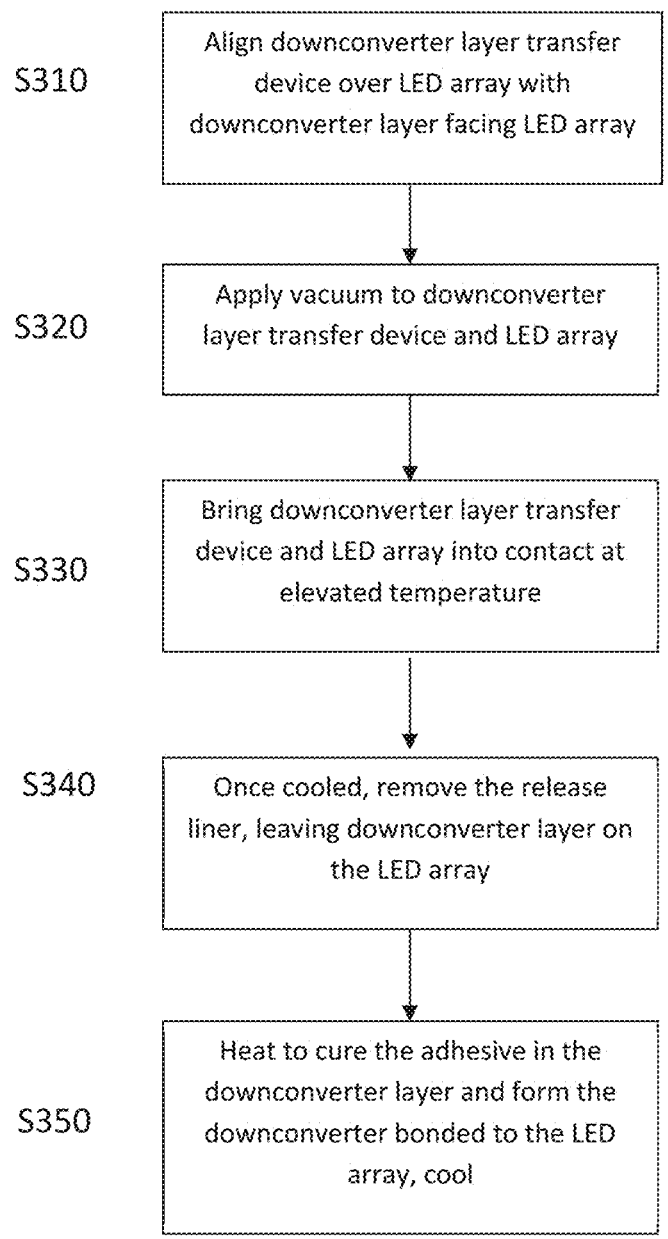
FIG. 3A shows a flow chart for, and FIGS. 3B, 3C, 3D and 3E illustrate, an example embodiment of a method for using a downconverter layer transfer device and resulting lighting device according to example embodiments.
Figure 3B:
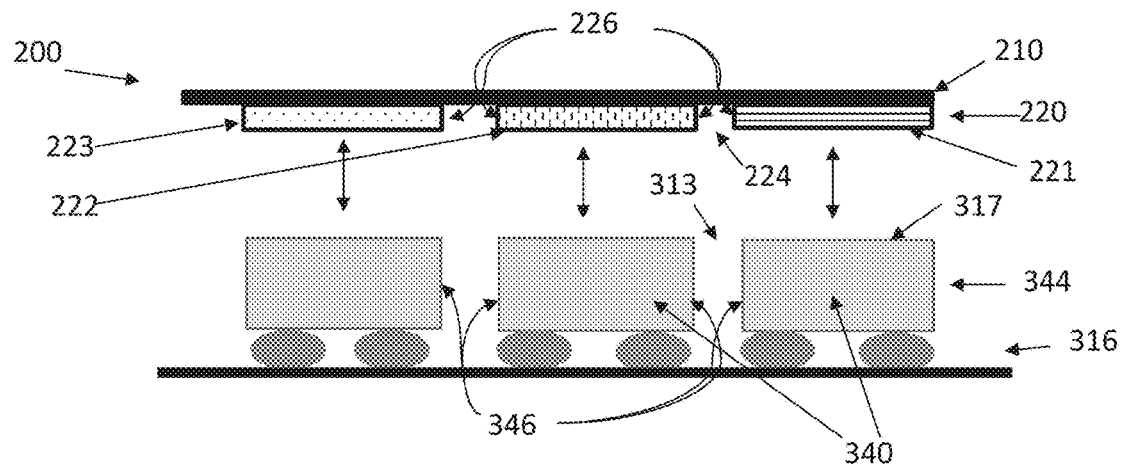

As shown in FIG. 3B, at S310, a downconverter layer transfer device 200 may be aligned over an LED array 344. The LED array 344 includes a plurality of individual LED dies 340 on a substrate 316. As shown in FIG. 3B, the downconverter layer 220 of the converter layer bonding device 200 is facing a surface 317 of the LED array 344 to which the downconverter layer 220 is to be applied. The surface 317 is a surface through which the LED die emits light. Each of the downconverter layer pixels 221, 222, 223 is facing surface 317 of one of the individual LED die 340. Edges 226 of the downconverter layer pixels 221, 222, 223 may align with edges 346 of the individual LED die 340 such that spaces 224 between downconverter layer pixels 221, 222, 223 are positioned over lanes 313 of LED array 344. Achieving good alignment between the individual downconverter layer pixels 221, 222, 223 and individual LED die 340 is important for improved performance of the micro-LED. A variety of methods may be used to achieve alignment. For example, fiducial markers as are known to persons of ordinary skill in the art may be placed (not shown) on downconverter layer transfer device 200 and the LED array 344 to allow precise alignment.

Figure 3C:
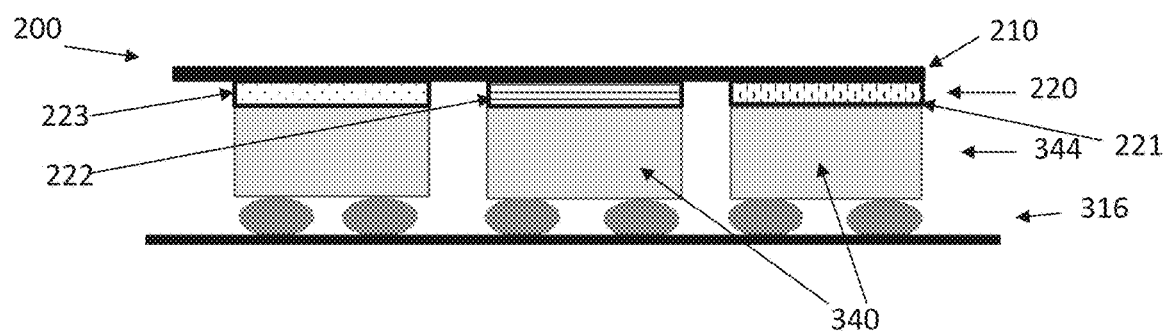
Figure 3D:
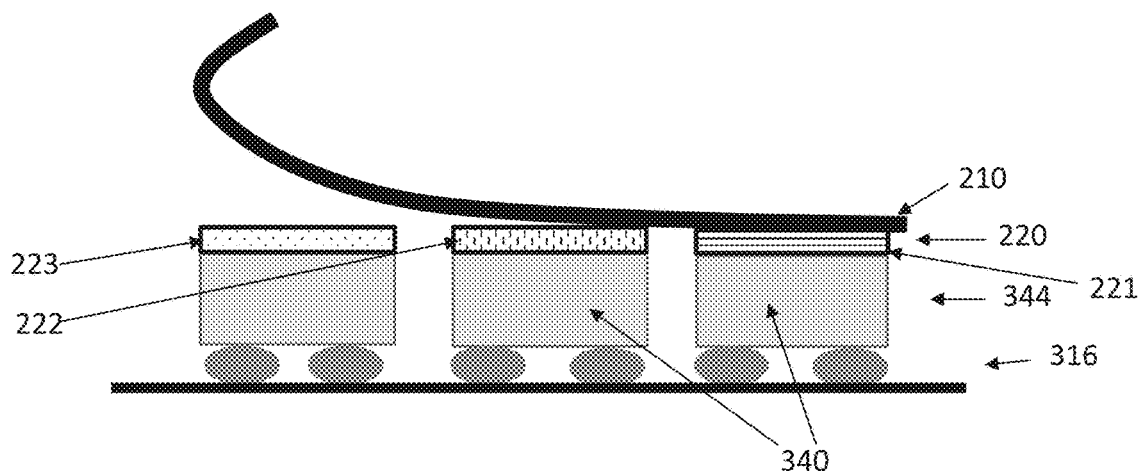

As shown in FIG. 3C, at S320, a vacuum may be applied to the downconverter layer transfer device 200 and LED array 344, and at S330, the downconverter layer transfer device 200 may be brought into contact with the LED array 344 at elevated temperatures. The temperature used depends on the particular adhesive material used in the downconverter layer transfer device 200. In general, the temperature is high enough to make the adhesive material used in the downconverter layer 220 flow and become tacky, i.e., adhesive, enough to stick to the surface 317 of the LED dies 340s. The elevated temperature may be chosen such that the shear modulus G* (at 1 Hz) is between shear modulus G*=1 KPa, and shear modulus G*=100 KPa, with tan delta typically between 0.5 and 3.0. At the same time, the temperature should be low enough to prevent excessive flow, so that the adhesive material used in downconverter layer 220 generally maintains its shape and coverage of the LED dies 340, without dripping or leaking over the edges of the LED dies 340. The LED array 344 with the downconverter layer transfer device 200 attached may then be cooled, for example, back to room temperature As shown in FIG. 3D, at S340, the release liner 210 may be removed, leaving the downconverter layer 220 behind on the LED array 344. As the adhesive material in downconverter layer 220, after heat treatment, is more strongly attached to the LED dies 340 than the release liner 210. The release liner 210 may be removed, for instance, mechanically, by peeling the release liner 210 off of the downconverter layer 220 that is attached to LED array 344. As noted above, the ensure clean transfer, the release liner 210 may be designed to have a peel strength between the downconverter layer 220 and release liner 210 of below 30 N/m, for example 1-5 N/m. The downconverter layer 220 remains on the LED array 344 after removal of release liner 210. In particular, the individual LED dies 340 have an individual downconverter layer pixel 221, 222, 223 attached to the surface 317 of the LED dies 340.

At S350, additional curing of the adhesive material in the downconverter layer 220 may be performed after removal of the release liner 210. For example, heat may be applied to fully cure the adhesive material in the downconverter layer 220 to convert it to the downconverter 363 as shown in FIG. 3E.

Figure 3E:
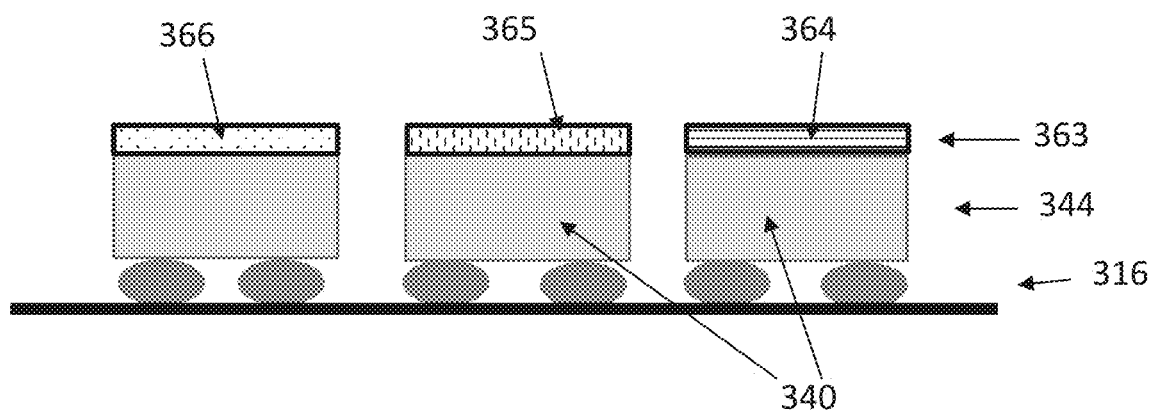

As shown in FIG. 3E, a fully cured downconverter layer 363 is bonded to the LED array 344. In particular, individual downconverter pixels 364, 365, and 366, which may contain different downconverter materials, are bonded to the individual LED dies 340 of the LED array 344.

Figure 4:
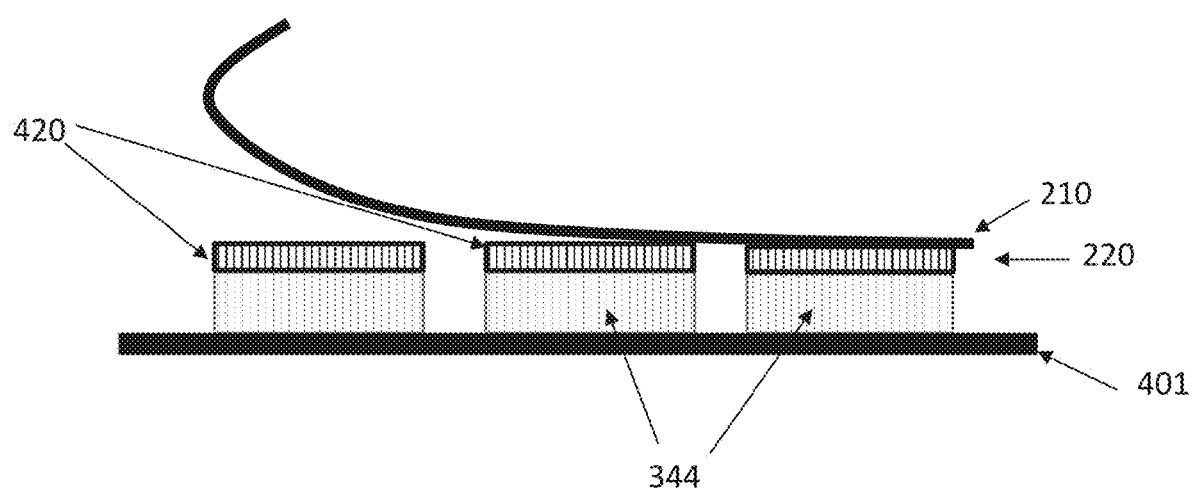
FIG. 4 illustrates an example embodiment of a method for using a downconverter layer transfer device to form multiple micro-array lighting devices.

FIGS. 3B-3D illustrate an expanded view of the process of using the downconverter layer transfer device 200 at the level of the individual LEDs 340 of an LED array 344, and individual downconverter pixels 364, 365, 366. The downconverter layer transfer device 200 may be made to be large enough to transfer downconverters to more than one LED array 344, as illustrated in FIG. 4. Each LED array 344 contains a plurality of LEDs 340 to form, for example, a micro-LED. Each LED array 344 is positioned on a substrate 401, which may be, for example, a carrier tape as is known by persons of ordinary skill in the art. The full downconverter layer transfer device 200 is shown, with the individual downconverter pixels formed in multiple arrays 420 on the release liner 210. The vacuum lamination, process disclosed with respect to FIGS. 3A-3D is applied, so as to form downconverters on multiple LED arrays 344 in a single manufacturing process.

Figure 5A:
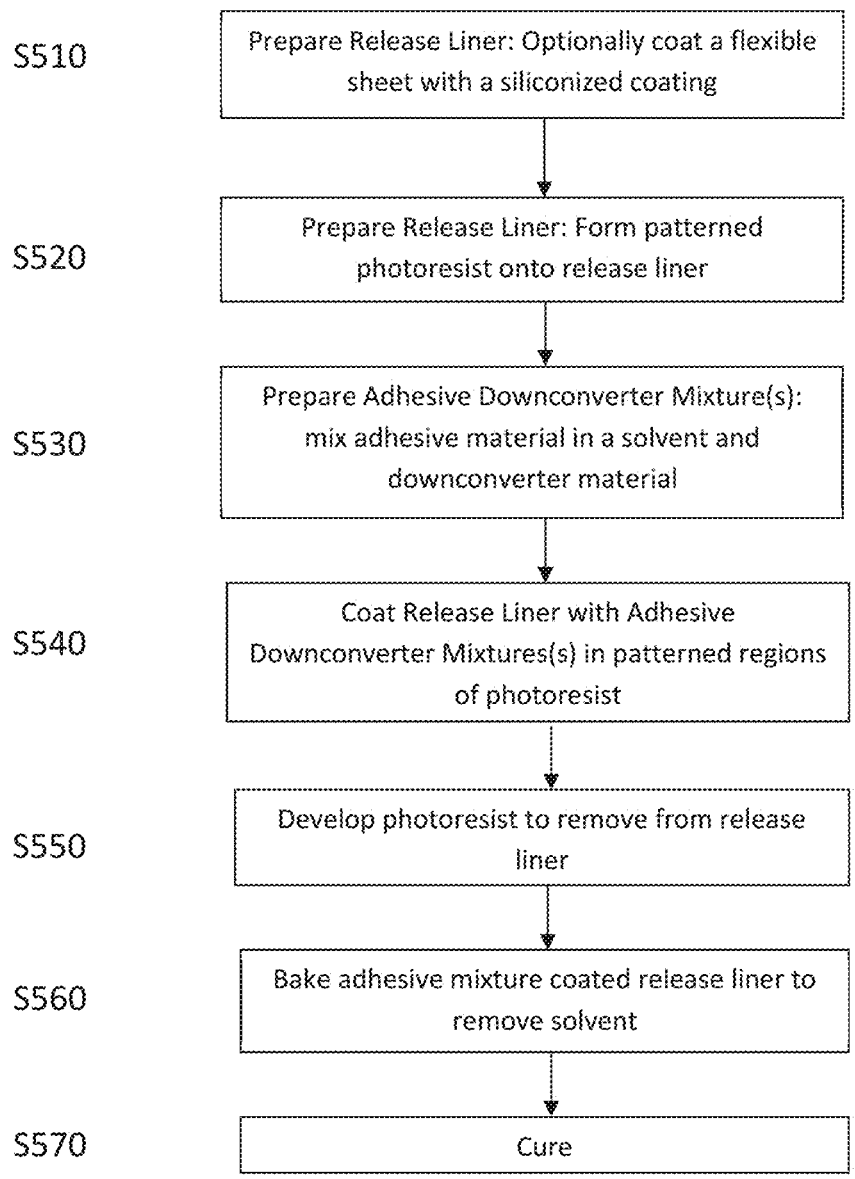
FIG. 5A shows a flow chart for, and FIGS. 5B, 5C, 5D, 5E, 5F and 5G illustrate, an example embodiment of a method of making a downconverter layer transfer device.
Figure 5B:
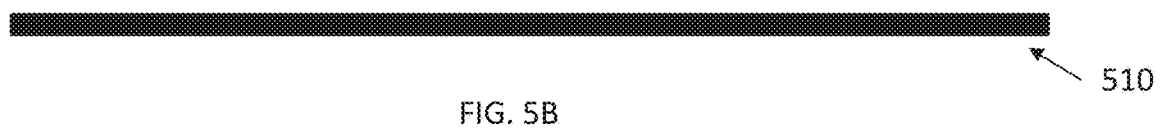
Figure 5C:
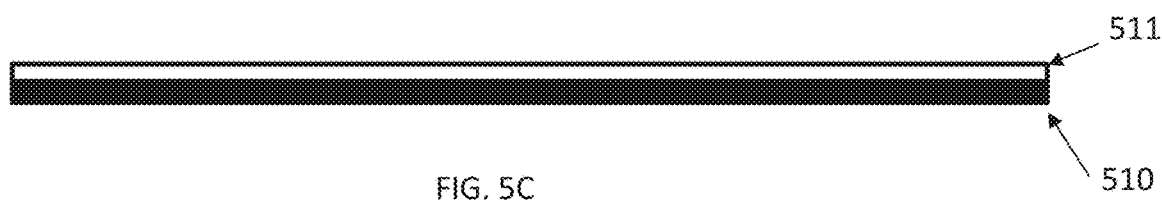

FIGS. 5A-5G show a flow chart and illustration of a method of making downconverter layer transfer device 200. FIG. 5B shows release liner 510, which may be a flexible sheet having the properties as described above with respect to release liner 210. At S510, as shown in FIG. 5C, the release liner 510 to be used may be coated with a siliconized coating 511 to enhance the release properties as described above. Siliconized coating 511 is optional.

Figure 5D:
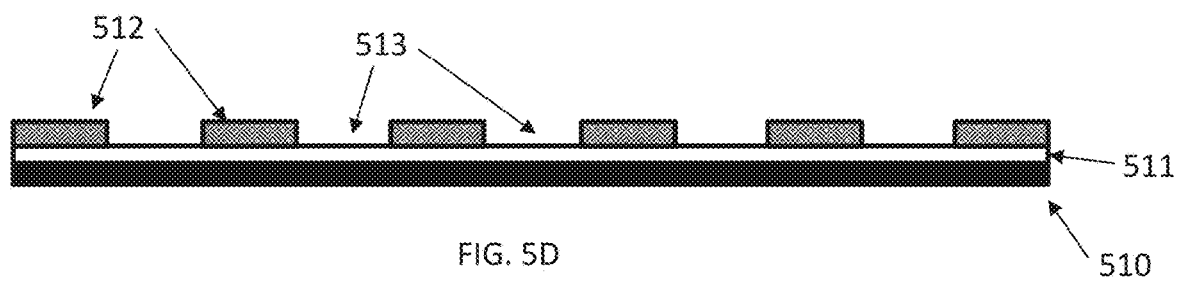
Figure 5E:
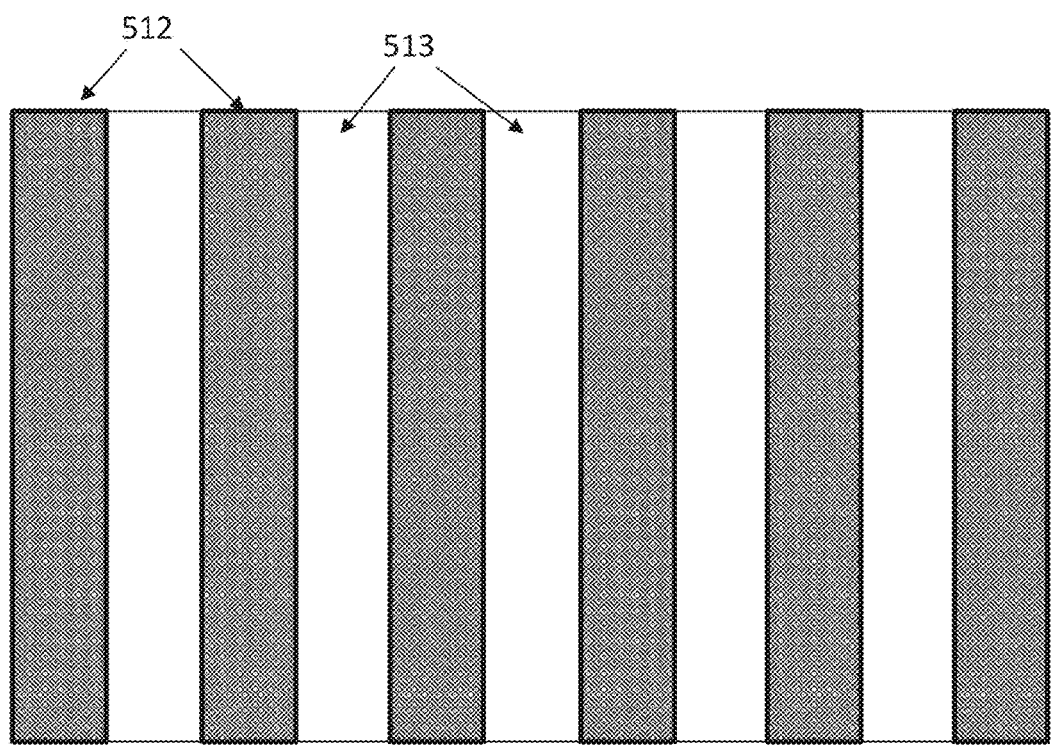

As shown in FIGS. 5D and 5E, at S520, a patterned photoresist 512 may be formed on the release liner 510. To form the patterned photoresist 512, a UV-curable resist is coated on to the release liner 510, and then imprinted to form a pattern structure with the inverse of the desired pixel dimensions. The imprinted UV-curable resist is then cured to leave patterned photoresist 512 with "wells" 513 in the photoresist pattern. As shown in FIG. 5E, in this example, patterned photoresist 512 is patterned into rows, but other patterns may be used depending on the final pattern of downconverter pixels that is desired. FIG. 5E also illustrates the patterned photoresist 512 having approximately the same width as the "wells" 513, but the sizes may vary and the photoresist 512 may be much narrower than the wells 513. In one example, a well may have a width of 50 µm and a depth of 45 µm.

At S530, one or more adhesive downconverter mixtures 501, 502 may be prepared by mixing the adhesive material, a downconverter material, and a solvent. For example, a resin and solvent, such as a methylphenylsiloxane resin and cyclohexanone solvent, or, in another example, a silicone resin (such as Dow Corning® LF-1112) and a propylene glycol methyl ether acetate solvent, may be mixed with one or more downconverter materials, such as a phosphor, organic dye, quantum dot, or scattering agent. The downconverter material is dispersed throughout the adhesive. A separate adhesive downconverter mixture 501, 502 is formed for each downconverter pixel type to be formed. For instance, if an RGB device is to be formed, an adhesive downconverter mixture with a red downconverter material, an adhesive downconverter mixture with a green downconverter material, and an adhesive downconverter mixture with a scattering agent, may each be formed. Mass ratios of adhesive material to solvent depend on the particular downconverter material used and the desired properties of light emitted from the device, and may be between, for example, 5:1 and 0.1:1, or even greater. The concentrations of adhesive material and solvent may be chosen to achieve the desired viscosity of the adhesive downconverter mixtures 501, 502. The viscosity of the adhesive downconverter mixtures 501, 502 may be chosen to optimize wetting of the release liner 510, while still achieving the desired thickness T of the resulting downconverter layer 520. For example, the viscosity of the adhesive downconverter mixture 501, 502 may in a range between 70 and 3,000 mPa·s (or cP).

Figure 5F:
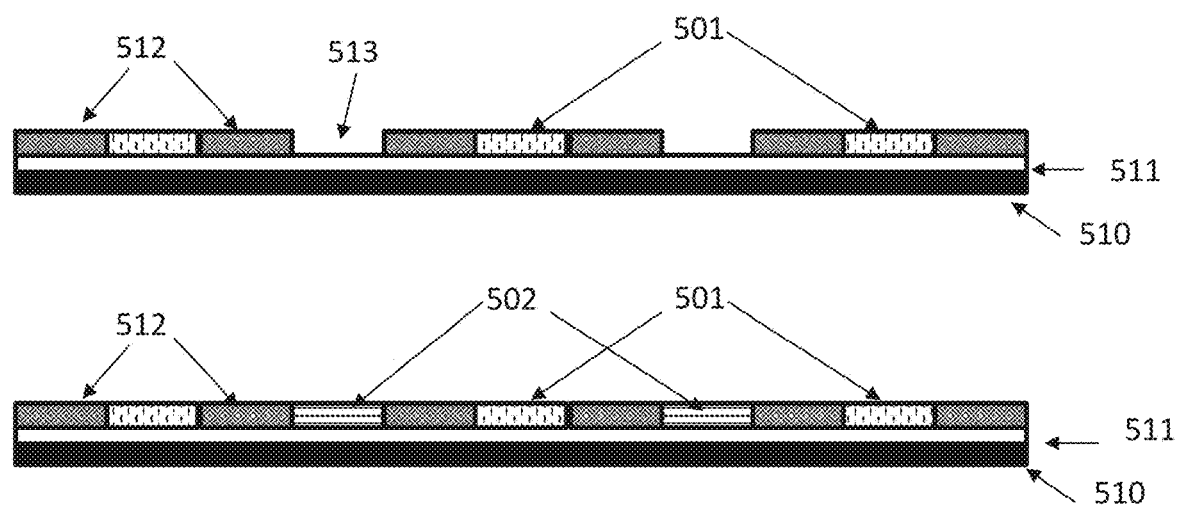

At S540, as shown in FIG. 5F, each adhesive downconverter mixture 501, 502 is coated onto the patterned regions of the photoresist 512. In particular, each adhesive downconverter mixture 501, 502 is coated onto the photoresist 512 so as to fill certain of the "well" area 513 of the photoresist 512 with adhesive downconverter mixture 501, 502. Any method that can suitably coat the release liner 210 with a uniform layer of the adhesive downconverter mixture 501, 502 at the desired thickness may be used, such as, for example, flexographoic printing, slot-die coating, or rotary screen printing. As shown in FIG. 5F, different adhesive downconverter mixtures 501, 502 are filled into different wells 513. For example, adhesive downconverter mixture 501 may be filled into every other well 513 and adhesive downconverter mixture 502 may fill the wells in between. Multiple, sequential coating passes may be needed for the separate adhesive downconverter mixtures 501, 502. That is, as shown in FIG. 5F, a first adhesive downconverter mixture 501 may be coated into a first sets of the wells 513, and then a second adhesive downconverter mixture 502 may be subsequently coated into wells 513 not filled with first adhesive downconverter mixture 501. If more than two adhesive downconverter mixtures are to be used, several coating passes, one for each of the different adhesive downconverter mixtures may be used.

Figure 5G:
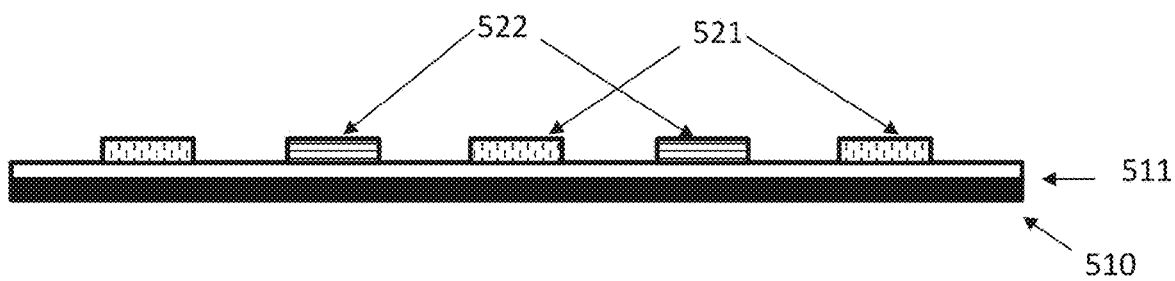

At S550, S560 once the adhesive downconverter mixtures 501, 502 are coated into the wells 513 of photoresist 512, the adhesive downconverter mixtures 501, 502 may be dried to form downconverter layer 520 having downconverter layer pixels 521, 522. The photoresist 512 may be developed to remove the photoresist 512, as shown in FIG. 5G, leaving downconverter layer transfer device 500 with downconverter layer pixels 522, 521 on the release liner 510. Removal of the photoresist at S560 may also occur before or during drying and/or partially curing of the adhesive downconverter mixture 510, 502 at S550.

Depending on the adhesive used, at S570 the adhesive downconverter mixture may be additionally cured to stabilize the material and improve uniformity of the downconverter layer 520.

An advantage of using a photoresist 512 such as shown in FIG. 5 above is that the edges (or sidewalls) for example, edges 526 of downconverter layer pixel 522, are well-defined, and there is no need for mechanical sawing of the downconverter layer to separate the pixels.

Figure 6:
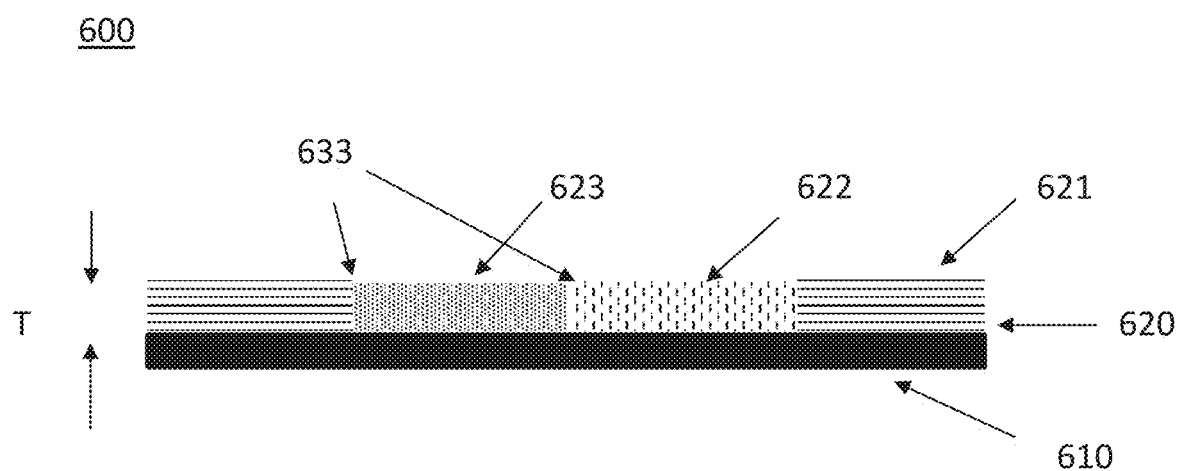
FIG. 6 is a cross-sectional view illustrating a downconverter layer transfer device according to another example embodiment.

FIG. 6 shows a side view of a portion of another example of a downconverter layer transfer device 600 that can be used to form pcLEDs, and, in particular, is useful for forming light emitting pixel arrays, such as RGB micro-LEDs. In the downconverter layer transfer device 600 shown in FIG. 6, downconverter layer 620 does not contain distinct and defined gaps or spaces between downconverter pixels, such as spaces 224 shown in FIG. 3B. Downconverter layer transfer device 600 includes a release liner 610 coated with a downconverter layer 620. Downconverter layer 620 includes one or more downconverter materials mixed with an adhesive material, as described above. Downconverter layer 620 may include portions of different types of downconverter materials in separate downconverter layer pixels 621, 622, 623. For example, downconverter layer pixel 621 may include a red downconverter material, downconverter layer pixel 622 may include a green downconverter material, and downconverter layer pixel 623 may contain only a scattering agent. The number of different downconverter materials used in downconverter layer 620, and the arrangement and colors of the different downconverter layer pixels may vary depending on the desired light emitting device to be manufactured. For example, an RGB pattern of downconverter layer pixels may repeat over the entirety of the downconverter layer transfer device. As shown in FIG. 6, the different adhesive downconverter pixels 621, 622, 623 are adjacent to each other, and may be in contact with each other at junctions 633. At junctions 633 there may be some mixing between the downconverter materials of the two adjacent downconverter pixels. The size of the downconverter layer pixels 621, 622, 623 is set so that when the downconverter layer 620 is transferred to the LED array 144, as described below, the downconverter layer pixels 621, 622, 623 are positioned on top of the individual LEDs 140, to produce a light emitting device as shown above in FIGS. 1A and 1B.

Figure 7A:
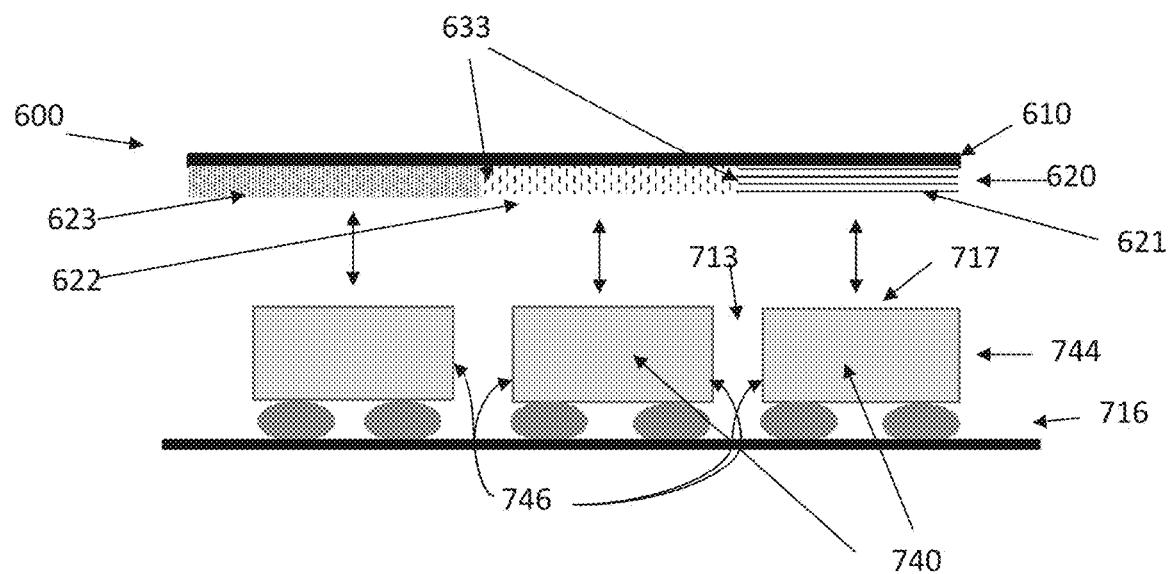
FIGS. 7A, 7B, 7C and 7D illustrate an example embodiment of a method for using a downconverter layer transfer device and resulting lighting device according to example embodiments.
Figure 7B:
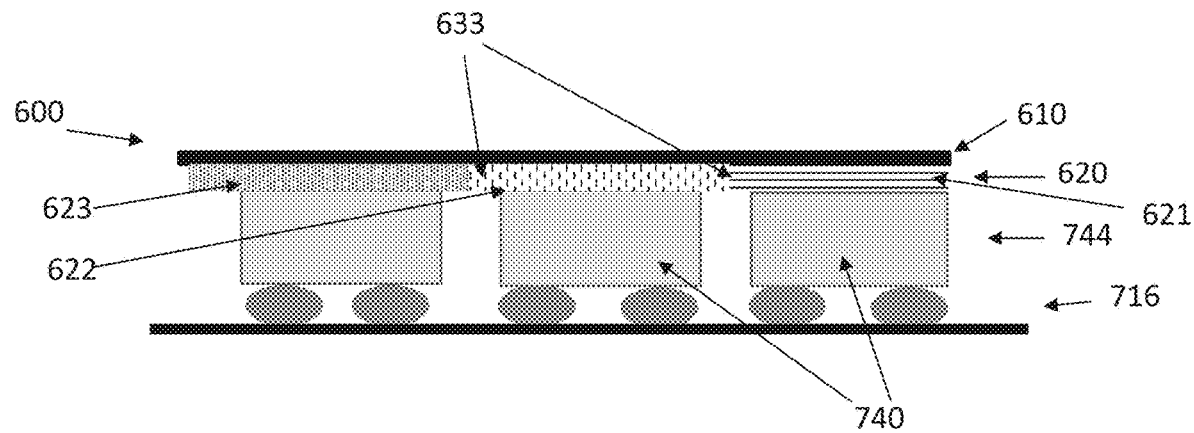
Figure 7C:
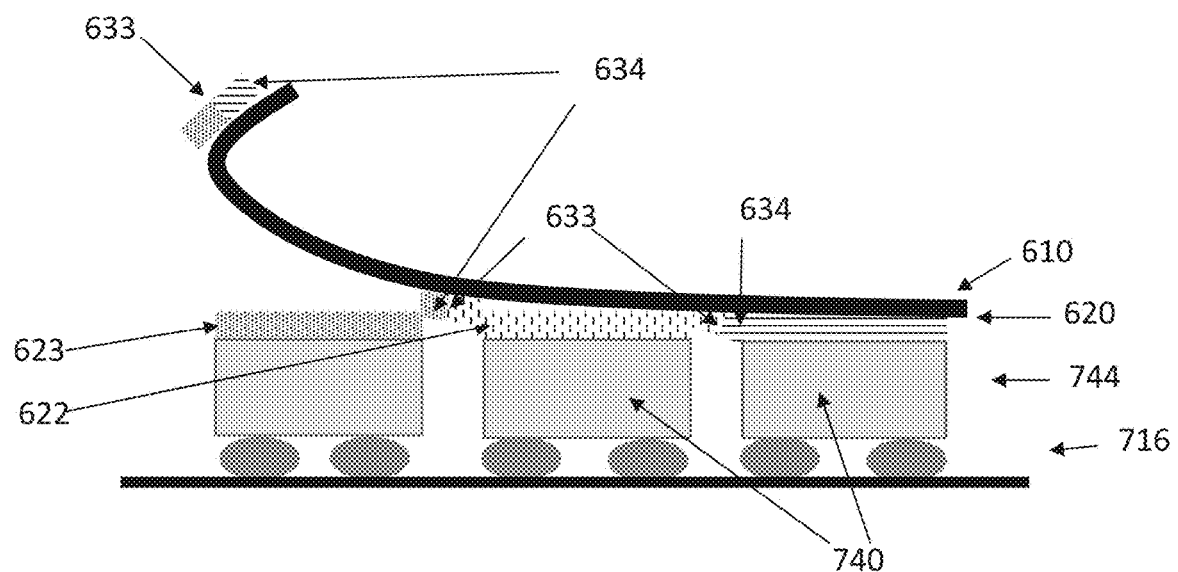

FIGS. 7A-7C shows a method for using the downconverter layer transfer device 600. The method generally follows the method set forth in the flow chart of FIG. 3A for downconverter layer transfer device 200, except that the downconverter layer transfer device 600 does not contain edges, such as edges 226 shown in FIG. 3B. As shown in FIG. 7A, a downconverter layer transfer device 600 may be aligned over an LED array 744. The LED array 744 includes a plurality of individual LED dies 740 on a substrate 716. As shown in FIG. 7A, the downconverter layer 620 of the converter layer bonding device 600 is facing a surface 717 of the LED array 744 to which the downconverter layer 620 is to be applied. The surface 717 is a surface through which LED die 740 emits light. Each of the downconverter layer pixels 621, 622, 623 is facing surface 717 of one of the individual LED die 740. Junctions 633 between the downconverter layer pixels 621, 622, 623 may align so as to be between edges 746 of the individual LED die 740 such that junctions 633 between downconverter layer pixels 621, 622, 623 are positioned over lanes 713 of LED array 744. Achieving good alignment between the individual downconverter layer pixels 621, 622, 623 and individual LED die 640 is important for improved performance of the micro-LED. A variety of methods may be used to achieve alignment, such as fiducial markers, as described above.

As shown in FIG. 7B, a vacuum may be applied to the downconverter layer transfer device 600 and LED array 744, and the downconverter layer transfer device 600 may be brought into contact with the LED array 744 at elevated temperatures. The temperature used depends on the particular adhesive material used in the downconverter layer transfer device 600, as described above with respect to FIG. 3C. The LED array 744 with the downconverter layer transfer device 600 attached may then be cooled, for example, back to room temperature As shown in FIG. 7C, the release liner 610 may be removed, leaving the downconverter layer 620 behind on the LED array 644. After heat treatment, the portions of the adhesive material in downconverter layer 620 positioned on the LED die 640 are more strongly attached to the LED dies 640 than the release liner 610. The release liner 610 may be removed, for instance, mechanically, by peeling the release liner 610 off of the downconverter layer 620 that is attached to LED array 744. The portions 634 of the adhesive material in downconverter layer 620 at the junctions 633, which are not in contact with an LED die 640, remain attached to the release liner after heat treatment, and therefore, as shown in FIG. 7C, when the release liner is removed, the portions 634 of the downconverter layer at junction 633 are removed with the release liner 610, leaving only the portions of the downconverter layer 620 that are positioned on the LED die 740 behind. Release liner 610 has a peel strength as noted above with respect to FIG. 3D. After removal of the release liner 610 and portions 634 of downconverter layer 620 at the junctions 633, the individual LED dies 740 have an individual downconverter layer pixel 621, 622, 623 attached to the surface 717 of the LED dies 740.

Figure 7D:
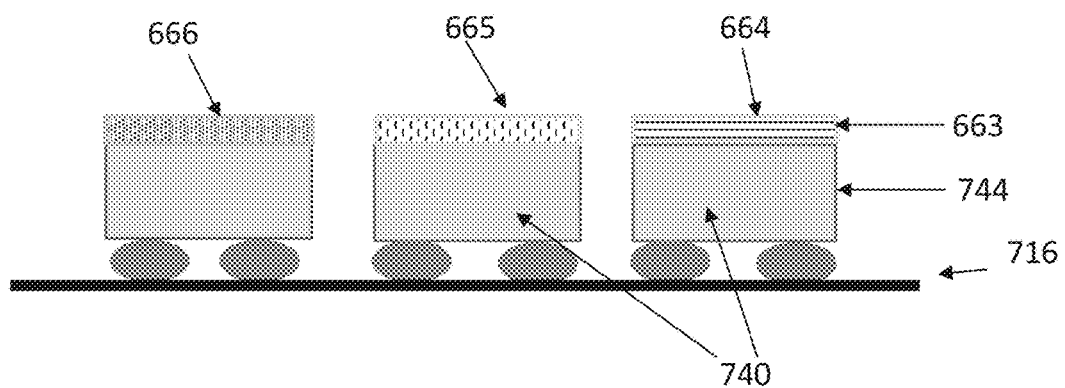

Additional curing of the adhesive material in the downconverter layer 620 may be performed after removal of the release liner 610, resulting in a fully cured downconverter layer 763 bonded to the LED array 344, as shown in FIG. 7D. In particular, individual downconverter pixels 764, 375, and 766, which may contain different downconverter materials, are bonded to the individual LED dies 740 of the LED array 744. The lighting device structure in FIG. 7D is essentially the same as the lighting device structure shown in FIG. 3E with the exception that without use of the phorotresist to form the downconverter layer 620, the edges of the downconverter pixels 664, 665, 666 may not be as well-defined as those of downconverter pixel.

In addition, or as an alternative, to removal of portions 634 with removal of the release liner 610, mechanical sawing may be used to separate downconverter layer pixels 621, 622, 623 positioned on LED dies 744, and remove any remaining portion 634 of the downconverter layer 620.

To prepare downconverter layer transfer device 600, a method similar that shown in FIG. 5A may be used, except that a photoresist is not used. Thus, similar to S510 of FIG. 5A, a release liner 610 may be optionally coated with a siliconized coating 611. A patterned photoresist is not formed on the release liner 610, that is, S520 is skipped. Similar to S530, one or more adhesive downconverter mixtures may be prepared by mixing the adhesive material, a downconverter material, and a solvent. The adhesive downconverter mixture is then coated onto the release liner in a predetermined pattern to form the downconverter layer 620 (FIG. 6), the predetermined pattern set so as to form the different downconverter layer pixels 621, 622, 623. This may be achieved using, for example, contact printing techniques such as gravure or flexographic printing.

As shown in FIG. 6, the different adhesive downconverter mixtures, when disposed on the release liner 610 to form the downconverter layer pixels 621, 622, 623 may be in contact with each other at junctions 633, and there may be some mixing of the downconverter materials at the junctions 633 within the adhesive forming the downconverter layer 620. However, when used to form the downconverter pixels, as shown in FIG. 7C, the junctions 633 where downconverter mixture may have mixed may be positioned to correspond to the gaps 713 between the LED dies 740. The portions 634 may then be removed with the release liner when it is removed, as shown in FIG. 7C, and/or by mechanically removing downconverter layer 620 that may remain over gaps 713 between dies.

This disclosure is illustrative and not limiting. Further modifications will be apparent to one skilled in the art in light of this disclosure and are intended to fall within the scope of the appended claims.

What is claimed is:

1. A downconverter layer transfer device comprising:
   a release liner; and
   a downconverter layer disposed on the release liner, the downconverter layer including a downconverter material dispersed throughout an adhesive, the downconverter layer being solid and non-adhesive at a first temperature, and adhesive at an elevated temperature above the first temperature,
   the downconverter layer comprising a first downconverter layer pixel and a second downconverter layer pixel, the first and second downconverter layer pixels have different downconverter materials, are disposed on different areas of the release liner, are adjacent to each other, and meet at junction.

2. The downconverter layer transfer device of claim 1, further comprising a siliconized layer disposed between the release liner and the downconverter layer.

3. The downconverter layer transfer device of claim 1, wherein the downconverter material comprises at least one of a phosphor, an organic dye, a quantum dot, and a scattering agent.

4. The downconverter layer transfer device of claim 1, wherein a shear modulus G* (at 1 Hz) of the downconverter layer at the first temperature is greater than 100 KPa, and the shear modulus G* (at 1 Hz) of the downconverter layer at the elevated temperature is between 1 KPa and 100 KPa.

5. A method of forming a lighting device, the method comprising:

providing a plurality of light emitting diodes mounted on a substrate, each light emitting diode having a light emitting surface;

providing a downconverter layer transfer device having a downconverter layer disposed on a release liner, the downconverter layer comprising a first downconverter material dispersed throughout an adhesive forming a first downconverter layer pixel and a second downconverter material forming a second downconverter layer pixel, the first and second downconverter materials are different from each other, the first and second downconverter layer pixels disposed on different areas of the release liner, are adjacent to each other, and meet at junction;

aligning the downconverter layer with the light emitting surfaces;

bringing the downconverter layer into contact with the light emitting surfaces at an elevated temperature, the elevated temperature being a temperature at which the adhesive adheres to the light emitting surfaces;

cooling the downconverter layer in contact with the light emitting surfaces of the plurality of light emitting diodes to a temperature below the elevated temperature; and removing the release liner, leaving the downconverter layer adhered to the light emitting surfaces of the plurality of light emitting diodes.

6. The method of claim 5, further comprising curing the downconverter layer.

7. The method of claim 5, wherein bringing the downconverter layer into contact with the light emitting surfaces at an elevated temperature includes applying a vacuum to the downconverter layer transfer device and the light emitting diodes.

8. The method of claim 5, wherein providing the downconverter layer transfer device comprises:
providing the release liner;
mixing the adhesive material, the first downconverter material, and a solvent to form a first adhesive downconverter mixture;
coating the release liner with the first adhesive downconverter mixture; and
removing the solvent from the first adhesive downconverter mixture to form the first downconverter layer pixel.

9. The method of claim 8, further comprising:
before coating the release liner with the first adhesive downconverter mixture, forming a photoresist pattern on the release liner, the photoresist pattern including wells,
wherein coating the release liner with the first adhesive downconverter mixture comprises disposing the first adhesive downconverter mixture in the wells; and
removing the photoresist pattern.

10. The method of claim 8, further comprising coating the release liner with a siliconized coating before coating the release liner with the first adhesive downconverter mixture.

11. The method of claim 5, wherein providing the downconverter layer transfer device comprises:
providing the release liner;
mixing the adhesive material, the first downconverter material, and a solvent to form a first adhesive downconverter mixture;
mixing the adhesive material, the second downconverter material, and the solvent to form a second adhesive downconverter mixture;
coating the release liner with the first adhesive downconverter mixture in a pixel pattern on a first area of the release liner;
coating the release liner with the second adhesive downconverter mixture in a pixel pattern on a second area of the release liner; and
removing the solvent from the first and second adhesive downconverter mixtures to form the first and second downconverter layer pixels.

12. The method of claim 11, further comprising coating the release liner with a siliconized coating before coating the release liner with the first adhesive downconverter mixture and the second adhesive downconverter mixture.

13. The method of claim 5, wherein the first downconverter material includes at least one of a phosphor, an organic dye, a quantum dot, and a scattering agent.

* * * * *